United States Patent
Kim et al.

(10) Patent No.: US 9,844,129 B2
(45) Date of Patent: Dec. 12, 2017

(54) TRANSPARENT CONDUCTOR AND OPTICAL DISPLAY APPARATUS COMPRISING THE SAME

(71) Applicant: SAMSUNG SDI CO., LTD., Yongin-si, Gyeonggi-do (KR)

(72) Inventors: Do Young Kim, Uiwang-si (KR); Kyoung Ku Kang, Uiwang-si (KR); Young Kwon Koo, Uiwang-si (KR); Dong Myeong Shin, Uiwang-si (KR); Hyoung Tae Lim, Uiwang-si (KR); Oh Hyeon Hwang, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 125 days.

(21) Appl. No.: 14/448,948

(22) Filed: Jul. 31, 2014

(65) Prior Publication Data

US 2015/0036298 A1    Feb. 5, 2015

(30) Foreign Application Priority Data

Jul. 31, 2013    (KR) .................. 10-2013-0091230

(51) Int. Cl.
*H05K 1/00*        (2006.01)
*H05K 1/18*        (2006.01)
(Continued)

(52) U.S. Cl.
CPC ............. *H05K 1/0274* (2013.01); *B32B 7/12* (2013.01); *B32B 15/02* (2013.01); *B32B 15/08* (2013.01);
(Continued)

(58) Field of Classification Search
CPC   C08K 3/08; C08L 33/06; B32B 15/02; B32B 15/08; B32B 2307/202;
(Continued)

(56) References Cited

U.S. PATENT DOCUMENTS 6,565,974 B1    5/2003  Uchiyama et al.
8,974,900 B2 *  3/2015  Eckert ................. H01L 31/1884
                                                                428/292.1
(Continued)

FOREIGN PATENT DOCUMENTS

CN           101866030 A      10/2010
KR     10-2013-0072133 A       7/2013
(Continued)

OTHER PUBLICATIONS

KIPO Office action dated Feb. 16, 2016, issued in KR Application No. 10-2013-0091230, with English translation, 12 pages.
(Continued)

*Primary Examiner* — Yuriy Semenenko
(74) *Attorney, Agent, or Firm* — Lewis Roca Rothgerber Christie LLP

(57) ABSTRACT

A transparent conductor includes a base layer, and a transparent conductive film on one or both sides of the base layer, the transparent conductive film including a metal nanowire, where the base layer includes a retardation film. An optical display apparatus includes the transparent conductor. The transparent conductor may compensate for a viewing angle of the optical display apparatus.

20 Claims, 3 Drawing Sheets

(51) Int. Cl.
| | |
|---|---|
| H05K 7/00 | (2006.01) |
| H05K 1/02 | (2006.01) |
| G02B 5/32 | (2006.01) |
| G06F 1/16 | (2006.01) |
| H05K 1/03 | (2006.01) |
| H05K 1/09 | (2006.01) |
| C08K 3/08 | (2006.01) |
| G02B 5/30 | (2006.01) |
| H01B 1/22 | (2006.01) |
| B32B 7/12 | (2006.01) |
| B32B 15/02 | (2006.01) |
| B32B 15/08 | (2006.01) |
| B32B 27/28 | (2006.01) |
| B32B 27/30 | (2006.01) |
| B32B 27/32 | (2006.01) |
| B32B 27/36 | (2006.01) |
| G02F 1/1343 | (2006.01) |
| G02F 1/1333 | (2006.01) |

(52) U.S. Cl.
CPC ......... *B32B 27/281* (2013.01); *B32B 27/286* (2013.01); *B32B 27/30* (2013.01); *B32B 27/302* (2013.01); *B32B 27/32* (2013.01); *B32B 27/325* (2013.01); *B32B 27/36* (2013.01); *B32B 27/365* (2013.01); *C08K 3/08* (2013.01); *G02B 5/3016* (2013.01); *G02B 5/32* (2013.01); *G06F 1/16* (2013.01); *H01B 1/22* (2013.01); *H05K 1/03* (2013.01); *H05K 1/09* (2013.01); *B32B 2307/202* (2013.01); *B32B 2307/412* (2013.01); *B32B 2457/00* (2013.01); *G02F 1/13338* (2013.01); *G02F 1/13439* (2013.01)

(58) Field of Classification Search
CPC ......... B32B 2307/412; B32B 2457/00; B32B 27/281; B32B 27/286; B32B 27/30; B32B 27/302; B32B 27/32; B32B 27/325; B32B 27/36

See application file for complete search history.

(56) References Cited

U.S. PATENT DOCUMENTS

| | | | |
|---|---|---|---|
| 2011/0052926 A1* | 3/2011 | Nakamura | H01B 1/22 428/461 |
| 2011/0285019 A1 | 11/2011 | Alden et al. | |
| 2012/0031460 A1 | 2/2012 | Hosoya et al. | |
| 2012/0256878 A1* | 10/2012 | Hashimoto | G06F 3/044 345/174 |
| 2013/0222317 A1 | 8/2013 | Abiru et al. | |
| 2013/0258570 A1* | 10/2013 | Nashiki | G06F 3/044 361/679.01 |
| 2013/0291683 A1* | 11/2013 | Sepa | H01B 1/22 75/370 |
| 2014/0302326 A1 | 10/2014 | Shin et al. | |

FOREIGN PATENT DOCUMENTS

| | | |
|---|---|---|
| TW | 201303907 A1 | 1/2013 |
| WO | WO 2012/046702 A1 | 4/2012 |
| WO | WO 2012-046702 A1 | 4/2012 |
| WO | WO 2012/161899 A1 | 11/2012 |
| WO | WO 2013/118643 A1 | 8/2013 |

OTHER PUBLICATIONS

Extended European Search Report dated Oct. 22, 2014 in EP Application No. 14179164.0 (7 pages).
Taiwan Patent Office action dated Jul. 7, 2015, issued in corresponding Application No. TW 103126043, 4 pages.
Chinese Office action dated Sep. 26, 2016, corresponding to Chinese Patent Application No. 201410374096.8 (8 pages).

* cited by examiner

TRANSPARENT CONDUCTOR AND OPTICAL DISPLAY APPARATUS COMPRISING THE SAME

CROSS-REFERENCE TO RELATED APPLICATION

This application claims priority to and the benefit of Korean Patent Application No. 10-2013-0091230, filed on Jul. 31, 2013, in the Korean Intellectual Property Office, the entire content of which is incorporated herein by reference.

BACKGROUND

1. Field

Embodiments of the present invention are directed toward a transparent conductor and an optical display apparatus including the same.

2. Description of the Related Art

Transparent conductors have been used in a wide variety of applications, including touch screen panels, flexible displays and the like for display devices, and thus have been actively studied in recent years. The transparent conductors should not only have good transparency, sheet resistance, etc., but also a bending property suitable for additional applications, such as flexible displays. Recently, a transparent conductor has been developed in which a conductive layer including metal nanowires such as silver nanowires and the like is formed. Such a transparent conductor has an advantage of having a good bending property. When used in a display, the contrast ratio of a general transparent conductor varies with the angle at which the observer views the display. Also, a general transparent conductor has a poor viewing angle as a result of retardation in the course of light passing through liquid crystals.

SUMMARY

A transparent conductor according to embodiments of the present invention may include a base layer; and a transparent conductive film on one or both sides of the base layer, the transparent conductive film including a metal nanowire, where the base layer may include (or be) a retardation film.

An optical display apparatus according to embodiments of the present invention may include the transparent conductor.

BRIEF DESCRIPTION OF THE DRAWINGS

The accompanying drawings, together with the specification, illustrate embodiments of the present disclosure, and, together with the description, serve to explain the principles of the present disclosure.

DETAILED DESCRIPTION

Figure 1:
FIG. 1 illustrates a cross-sectional view of a transparent conductor according to one embodiment of the present invention.

Certain embodiments of the present invention will now be described such that they may be made by a person with ordinary skill in the art with reference to the accompanying drawings. The present invention may be modified in many different ways and is not limited to the following embodiments. In the drawings, elements that should be apparent to those of ordinary skill in the art are omitted for clarity. The same reference numerals are used throughout the drawings and the description to refer to the same or similar parts. As used herein, terms such as "upper side" and "lower side" are defined with reference to the accompanying drawings. Thus, it will be understood that the term "upper side" may be used interchangeably with the term "lower side" when viewed from different angles. Also, in the context of the present application, when a first element is referred to as being "on" a second element, it can be directly on the second element or be indirectly on the second element with one or more intervening elements interposed therebetween.

In the context of the present application, "Ro" refers to "a retardation value of an In-plane direction" and may be defined by Formula 1:

$$Ro = (nx - ny) \times d \qquad \text{Formula 1}$$

In Formula 1, nx and ny are refractive indices in the x-axis and y-axis directions of the film, respectively, and d is a thickness of the film in nanometers (nm).

Also, in the context of the present application, "Rth" means "a retardation value of a thickness direction" and may be defined by Formula 2:

$$Rth = ((nx + ny)/2 - nz) \times d \qquad \text{Formula 2}$$

In Formula 2, nx, ny, and nz are refractive indices in the x-axis, y-axis, and z-axis directions of the film, respectively, and d is a thickness of the film in nm.

In the embodiments of the present application, refractive indexes represented by nx, ny or nz, may be measured by using AxoScan (Axometrics, Inc.) at each wavelength 450 nm, 550 nm and 650 nm.

In the context of the present application, the term "(meth) acryl," and similar terms, may refer to, for example, an acryl and/or a methacryl.

A transparent conductor according to an embodiment of the present invention may include a base layer; and a transparent conductive film on (e.g., formed on) one or both sides of the base layer. The base layer may be a retardation film. Thus, the transparent conductor of an embodiment of the present invention may have an effect of compensating viewing angles (e.g., may compensate for an angle at which a display is viewed).

Figure 4:
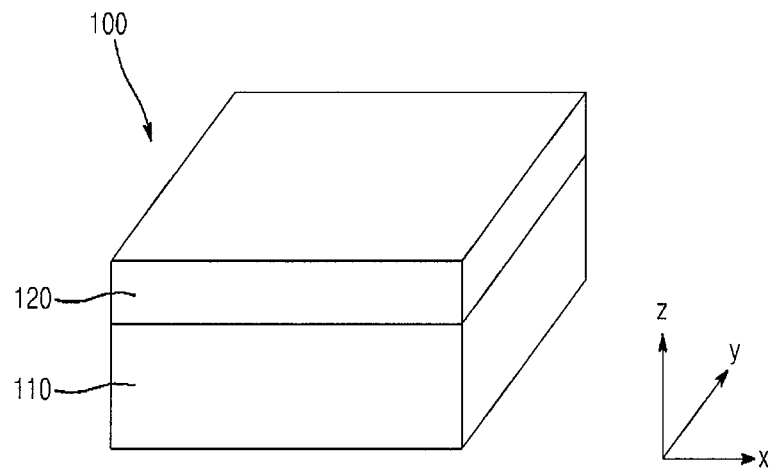
FIG. 4 illustrates a conceptual diagram of a transparent conductor according to one embodiment of the present invention.

Hereinafter, embodiments of the present invention will be described with reference to FIG. 1 and FIG. 4.

FIG. 1 is a cross-sectional view of a transparent conductor according to one embodiment of the present invention. FIG. 4 is a perspective view of a conceptual diagram of a transparent conductor according to one embodiment of the present invention. Referring to FIG. 4, the direction of an x-axis of a transparent conductor 100 according to one embodiment of the present invention is the same (or substantially the same) as a machine direction MD of a base layer 110, the direction of a y-axis is the same (or substantially the same) as a transverse direction TD of the base layer 110, and the direction of a z-axis is the same (or substantially the same) as a thickness direction of the base layer 110. In FIG. 4, the x-axis, y-axis and z-axis are orthogonal each other. Although FIG. 4 illustrates a transparent conductor having a transparent conductive film on (e.g., formed on) one side thereof, the transparent conductor may also have a transparent conductive film on (e.g., formed on) both sides thereof.

Referring to FIG. 1, according to one embodiment of the present invention, a transparent conductor 100 may include a base layer 110; and a transparent conductive film 120 on (e.g., formed on) the base layer 110. The base layer 110 may be a retardation film such that the transparent conductor 100 may compensate for retardation as a result of good wavelength dispersion.

In one embodiment, the transparent conductor 100 itself compensates for $\lambda/2$ or $\lambda/4$ retardation. For example, the transparent conductor 100 may have a Ro value of 120 nm to 150 nm or 120 nm to 135 nm at a wavelength of 450 nm. And Ro value of the transparent conductor 100 may be 135 nm to 155 nm or 140 nm to 150 nm at a wavelength of 550 nm. And, Ro value of the transparent conductor 100 may be 130 nm to 155 nm or 145 nm to 155 nm at a wavelength of 650 nm.

In one embodiment, the transparent conductor 100 may have a Rth value of 50 nm to 70 nm at a wavelength of 450 nm. And Rth value of the transparent conductor 100 may be 50 nm to 80 nm or 65 nm to 75 nm at a wavelength of 550 nm. And, Rth value of the transparent conductor 100 may be 50 nm to 80 nm or 65 nm to 75 nm at a wavelength of 650 nm.

In one embodiment, the transparent conductor 100 may have a nx value of 1.50 nm to 1.65 nm at a wavelength each of 450 nm, 550 nm or 650 nm. And ny value of the transparent conductor 100 may be 1.50 nm to 1.65 nm at a wavelength each of 450 nm, 550 nm or 650 nm. And, nz value of the transparent conductor 100 may be 1.50 nm to 1.65 nm at a wavelength each of 450 nm, 550 nm or 650 nm.

In some embodiments, the transparent conductor compensates for, or has, a $\lambda/4$ retardation (e.g., the transparent conductor is a quarter wavelength retardation plate) or a $\lambda/2$ retardation (e.g., the transparent conductor is a half wavelength retardation plate). In some embodiments, when the transparent conductor is a quarter wavelength retardation plate, the transparent conductor may be configured to phase shift light that passes through the transparent conductor by, for example, 90 degrees, and may, for example, convert linearly polarized light that passes through the transparent conductor to elliptical or circularly polarized light. In some embodiments, when the transparent conductor is a half wavelength retardation plate, the transparent conductor may be configured to phase shift light that passes through the transparent conductor by, for example, 180 degrees.

In one embodiment, the transparent conductor 100 may have a ratio B/A of about 0.9 to about 1.1, B/A being a ratio of an Ro value B in nanometers (nm) at a wavelength of 450 nm to an Ro value A in nm at a wavelength of 550 nm. Within the foregoing range of B/A, an improved viewing angle and enhanced visibility may be achieved. For example, B/A may generally be about 0.9 to about 1.06.

In another embodiment, the transparent conductor 100 may have a ratio C/A of about 0.9 to about 1.1, C/A being a ratio of an Ro value C in nm at a wavelength of 650 nm to an Ro value A in nm at a wavelength of 550 nm. Within the foregoing range of C/A, an improved viewing angle and enhanced visibility may be achieved. For example, C/A may be about 1.001 to about 1.1.

The transparent conductor 100 may exhibit transparency in the range of visible light, for example, at a wavelength of about 400 nm to about 700 nm. In one embodiment, the transparent conductor 100 may have a haze value of about 0% to about 1.5%, for example, about 0.01% to about 1.5%, and a total transmittance (e.g., a total light transmittance) of about 90% or more to about 100% or less, for example, about 90% to about 95%, as measured using a haze meter at a wavelength of about 400 nm to about 700 nm. Within any of the foregoing ranges, the transparent conductor may exhibit good transparency and may be used as a transparent conductor.

The transparent conductor 100 may have a sheet resistance of about 150 ($\Omega/\square$) or less, for example, about 50 ($\Omega/\square$) to about 150 ($\Omega/\square$), or about 30 ($\Omega/\square$) to about 100 ($\Omega/\square$), as measured using a 4-Pin probe. Within any of the foregoing ranges, due to the low sheet resistance, the transparent conductor may be used as an electrode film for touch panels, and may be applied to large touch panels.

The transparent conductor 100 may have a thickness, without limitation, of about 10 μm to about 250 μm, for example, about 50 μm to about 150 μm. Within any of the foregoing ranges, the transparent conductor may be used as a transparent electrode film such as a transparent electrode film for touch panels, including flexible touch panels.

The transparent conductor 100 may be used as a transparent electrode film for an apparatus, such as touch panels, E-papers, or solar cells.

The base layer 110 may be a retardation film, and the transparent conductor may have an effect of compensating viewing angles (e.g., may compensate for an angle at which a display is viewed). In one embodiment, the base layer may be a $\lambda/2$ or $\lambda/4$ retardation film.

In one embodiment, the base layer may have a Ro value of 120 nm to 150 nm or 125 nm to 140 nm at a wavelength of 450 nm. And Ro value of the base layer may be 50 nm to 280 nm, 50 nm to 200 nm, 250 nm to 280 nm, 130 nm to 155 nm or 140 nm to 150 nm at a wavelength of 550 nm. And, Ro value of base layer 100 may be 130 nm to 155 nm or 145 nm to 155 nm at a wavelength of 650 nm.

In one embodiment, the base layer may have a Ro value of 120 nm to 150 nm or 125 nm to 140 nm at a wavelength of 450 nm. And Ro value of the base layer may be 50 nm to 280 nm, 50 nm to 200 nm, 250 nm to 280 nm, 130 nm to 155 nm or 140 nm to 150 nm at a wavelength of 550 nm. And, Ro value of base layer 100 may be 130 nm to 155 nm or 145 nm to 155 nm at a wavelength of 650 nm.

In one embodiment, the base layer may have a nx value of 1.50 nm to 1.65 nm at a wavelength each of 450 nm, 550 nm or 650 nm. And ny value of the base layer may be 1.50 nm to 1.65 nm at a wavelength each of 450 nm, 550 nm or 650 nm. And, nz value of the base layer may be 1.50 nm to 1.65 nm at a wavelength each of 450 nm, 550 nm or 650 nm.

In one embodiment, the base layer may be a $\lambda/2$ retardation film, which may have a retardation value of the In-plane direction (Ro) of about 250 nm to about 280 nm, and a retardation value of the thickness-direction (Rth) of about 50 nm to about 200 nm, at a wavelength of 550 nm. In another embodiment, the base layer may be a $\lambda/4$ retardation film, which may have a retardation value of the In-plane direction (Ro) of about 130 nm to about 150 nm, and a retardation value of the thickness-direction (Rth) of about 30 nm to about 80 nm, at a wavelength of 550 nm.

In some embodiments, the base layer has a λ/4 retardation (e.g., the base layer is a quarter wavelength retardation plate) or a λ/2 retardation (e.g., the base layer is a half wavelength retardation plate). In some embodiments, when the base layer is a quarter wavelength retardation plate, the base layer may be configured to phase shift light that passes through the base layer by, for example, 90 degrees, and may, for example, convert linearly polarized light that passes through the base layer to elliptical or circularly polarized light. In some embodiments, when the base layer is a half wavelength retardation plate, the base layer may be configured to phase shift light that passes through the base layer by, for example, 180 degrees.

In one embodiment, the base layer may be a Retardation PC film, which may have nx value of 1.50 nm to 1.65 nm, ny value of 1.50 nm to 1.65 nm, nz value of 1.50 nm to 1.65 nm at each wavelength of 450 nm, 550 nm or 650 nm. In another embodiment, the base layer may be a Retardation COP film, which may have nx value of 1.55 nm to 1.65 nm, ny value of 1.55 nm to 1.65 nm, nz value of 1.55 nm to 1.65 nm at each wavelength of 450 nm, 550 nm or 650 nm.

The base layer 110 may be a film having transparency (e.g., a transparent film). In one embodiment, the base layer may include a film having a transmittance (e.g., a light transmittance) of about 85% to about 100%, for example, about 90% to about 99% at a wavelength of 550 nm.

The base layer 110 may include a film including (or formed with) an optical transparent resin including, but not limited to, a polycarbonate, a cyclic olefin, a polyester, a non-cyclic polyolefin, a polysulfone, a polyimide, a silicone, a polystyrene, a polyacryl, and/or a polyvinyl chloride resin film. The polyester resin film may include e.g., polyethylene terephthalate (PET), polyethylene naphthalate and/or the like.

The base layer 110 may be a single layer resin film or the base layer 110 may be a laminate including two or more resin films stacked together.

The base layer may 110 have a thickness of about 10 μm to about 200 μm, for example, about 50 μm to about 150 μm. Within any of the foregoing ranges, the transparent conductor may provide an effect of compensating viewing angles (e.g., may compensate for an angle at which a display is viewed) when used in displays.

Functional layers may be further stacked on one or both sides of the base layer 110. The functional layers may include one or more of a hard coating layer, an anti-corrosive layer, an anti-glare coating layer, an adhesion promoter, a coating layer for preventing (or reducing) elution of an oligomer from the base layer, and/or the like, but the functional layers are not limited thereto.

The transparent conductive film 120 may be a conductive layer including a conductive network formed from metal nanowires. As a result, the transparent conductive film 120 may exhibit conductivity (e.g., electrical conductivity), and provide good flexibility and bending properties. As such, the transparent conductive film may be formed into an electrode by a patterning method including etching and/or the like to have flexibility, and thus may be used in flexible devices.

The transparent conductive film 120 may include a matrix; and a conductive network of the metal nanowires impregnated in the matrix. The matrix may increase (or improve) adhesion of the base layer 110 to the transparent conductive film 120 and improve solvent resistance of the transparent conductive film 120, and prevent (or reduce) exposure of the metal nanowires to prevent (or reduce) oxidation of the metal nanowires. The matrix may be formed with (e.g., formed from) a composition including a binder and an initiator. In one embodiment, the transparent conductive film may include about 13 wt % to about 23 wt % of the metal nanowires, and about 77 wt % to about 87 wt % of the matrix, based on the total weight of the transparent conductive film. Within the foregoing ranges, the transparent conductive film may have good conductivity (e.g., electrical conductivity), and its increased adhesion to the base layer may be expected.

In one embodiment, the transparent conductive film 120 may include a metal nanowire layer including a cured product of the metal nanowire, the binder and the initiator, and an overcoat layer including a cured product of the binder and the initiator on the metal nanowire layer. The transparent conductive film 120 may be prepared by coating and drying a metal nanowire layer composition including the metal nanowires, a solvent or solvents, the binder and an additive (e.g., thickeners, dispersants, etc.) on the base layer to form a coating layer including a metal nanowire network (e.g., a wet thin coating layer), and coating and curing an overcoat layer composition including the binder, the solvent or solvents and the initiator on the coating layer. When the overcoat layer composition is coated, it may permeate and fill an empty space (or spaces) of the metal nanowire network, and may be then cured to form the matrix of the transparent conductive film. In the transparent conductive film, the overcoat layer is on (e.g., formed on) the metal nanowire layer to prevent (or reduce) oxidation of the metal nanowires. It is possible to stack any suitable laminate stably on the transparent conductive film by decreasing the roughness of a surface of the metal nanowire layer. The metal nanowire layer may be on (e.g., formed on) and incorporated into the overcoat layer. The term "incorporated," as used herein, means that the metal nanowire layer and the overcoat layer are not bonded to each other by an adhesive layer and so on, and do not have an independently separable form. For example, the metal nanowire layer and the overcoat layer may be included in a single (or sole) layer (e.g., the transparent conductive film).

In another embodiment, the transparent conductive film 120 may include a metal nanowire layer including a cured product of a metal nanowire, a binder and an initiator, and may be prepared by coating and curing the transparent conductive film composition including the metal nanowire, the binder, the initiator, the additive (e.g., thickeners, dispersants, etc.) and the solvent or solvents on the base layer.

The metal nanowire has much better dispersibility than a metal nanoparticle due to the shape of the nanowire. Furthermore, due to the difference in shapes between the metal nanoparticles and the metal nanowires, the metal nanowires may substantially (or significantly) reduce the sheet resistance of the transparent conductive film.

The metal nanowires may have an ultrafine line shape having a set (e.g., a predetermined or specific) cross-section. In one embodiment, the metal nanowire has an aspect ratio L/d of about 10 to about 1,000, the aspect ratio L/d being a length L to a diameter d of a cross-section of the metal nanowire. Within the foregoing range, even when the metal nanowires are included in the transparent conductive film at a low density, the network has high conductivity (e.g., electrical conductivity), and also the transparent conductor having low sheet resistance may be achieved. For example, the aspect ratio may be about 500 to about 1,000, or, for example, about 500 to about 700.

The metal nanowire may have a diameter (d) of a cross-section of more than about 0 nm to about 100 nm or less. Within the foregoing range, due to the high L/d, a transparent conductor having high conductivity (e.g., electrical conductivity) and low sheet resistance may be achieved. For example, the diameter may be about 30 nm to about 100 nm, or, for example, about 60 nm to about 100 nm.

The metal nanowire may have a length (L) of not less than about 20 μm. Within the foregoing range, due to the high L/d, a transparent conductor having high conductivity (e.g., electrical conductivity) and low sheet resistance may be achieved. For example, the length may be about 20 μm to about 50 μm.

The metal nanowire may include a nanowire prepared from any suitable metal. For example, the metal nanowire may include a nanowire prepared from silver, copper, gold, or a mixture thereof. In some embodiments, the nanowire may be prepared from silver or a silver containing mixture.

The metal nanowire may be prepared by any suitable method available in the art, or the metal nanowire may be a commercially available product. For example, the metal nanowire may be synthesized by reduction of a metal salt (for example, silver nitrate (Ag $NO_3$)) in the presence of a polyol and polyvinylpyrrolidone. In another embodiment, the metal nanowire may include a product commercially available from Cambrios Technologies Corporation (for example, ClearOhm™ ink, a solution including a metal nanowire).

The transparent conductive film 120 may include not less than about 13 wt % of the metal nanowire, for example, about 13 wt % to about 23 wt %, based on the total weight of the transparent conductive film 120. Within any of the foregoing ranges, the transparent conductive film may have suitable (or sufficient) conductivity (e.g., electrical conductivity), and form the conductive network.

The binder may be contained in the metal nanowire layer composition, the overcoat layer composition, and/or the transparent conductive film composition. The binder may include one or more of a monomer and an oligomer having a curable functional group (for example, a (meth)acrylate group). In one embodiment, the binder may include one or more of a urethane (meth)acrylate oligomer, a (meth)acrylate based monofunctional monomer or a (meth)acrylate based multifunctional monomer.

The (meth)acrylate based monofunctional monomer or (meth)acrylate based multifunctional monomer may include a (meth)acrylic monomer having a functionality of not less than 1, for example, 1 to 6, such as (meth)acrylate having a linear alkyl group including 1 carbon atom to 20 carbon atoms, (meth)acrylate having a branched alkyl group including 3 carbon atoms to 20 carbon atoms, (meth)acrylate having a hydroxyl group bonded to a functional group including 1 carbon atom to 20 carbon atoms, (meth)acrylate having a cycloaliphatic group including 3 carbon atoms to 20 carbon atoms, multifunctional (meth)acrylate having a multivalent alcohol group including 3 to 20 carbon atoms, and mixtures thereof.

For example, the (meth)acrylate based monofunctional monomer may include, but is not limited to, isobornyl (meth)acrylate, cyclopentyl (meth)acrylate, cyclohexyl (meth)acrylate and/or the like.

For example, the (meth)acrylate based multifunctional monomer may include, but is not limited to, trimethylolpropane di(meth)acrylate, trimethylolpropane tri(meth)acrylate, ditrimethylolpropane tetra(meth)acrylate, pentaerythritol tri(meth)acrylate, pentaerythritol tetra(meth)acrylate, tris(2-hydroxyethyl)isocyanurate tri(meth)acrylate, glycerol tri (meth)acrylate, ethylene glycol di(meth)acrylate, neopentylglycol di(meth)acrylate, hexanediol di(meth)acrylate, dipentaerythritol penta(meth)acrylate, dipentaerythritol hexa(meth)acrylate, cyclodecane dimethanol di(meth)acrylate and/or the like.

The initiator may be any suitable initiator without limitation, as long as it absorbs light at an absorption wavelength of about 150 nm to about 500 nm to induce (or initiate) a photoreaction. For example, the initiator may include phosphine oxide initiators, α-hydroxyketone initiators and/or the like. For example, the initiator may include bis-acyl-phosphine oxide, diphenyl (2,4,6-trimethylbenzoyl) phosphine oxide, 1-hydroxycyclohexylphenylketone or a mixture thereof.

The additive may include thickeners, dispersants and/or the like, and may be included in a solution including the metal nanowire (for example, ClearOhm™ ink available from Cambrios Technologies Corporation) to provide the metal nanowires.

The solvent may include a main solvent and a co-solvent. The main solvent may include water, acetone and/or the like, and the co-solvent may include alcohols, such as methanol and/or the like to provide suitable miscibility with water and acetone.

In one embodiment, the transparent conductive film 120 may be a cured product of a composition including about 13 wt % to about 23 wt % of the metal nanowire, about 75 wt % to about 85 wt % of the binder, and about 1 wt % to about 3 wt % of the initiator based on the total weight of solids in the composition. Within the foregoing ranges, an effect of reducing the number of processes associated with forming the transparent conductive film 120 may be achieved by using a single (or sole) coating.

In another embodiment, the transparent conductive film 120 may be a cured product of a composition including about 13 wt % to about 23 wt % of the metal nanowire, about 75 wt % to about 85 wt % of the binder and the additive, and about 1 wt % to about 3 wt % of the initiator based on the total weight of solids in the composition. Within the foregoing ranges, an effect of reducing the number of processes associated with forming the transparent conductive film 120 may be achieved by using a single coating.

The transparent conductive film 120 may have a thickness of about 10 nm to about 1 μm, for example, about 50 nm to about 500 nm, or about 100 nm to about 200 nm. Within any of the foregoing ranges, the first transparent conductor may be used as a film for touch panels.

Figure 2:
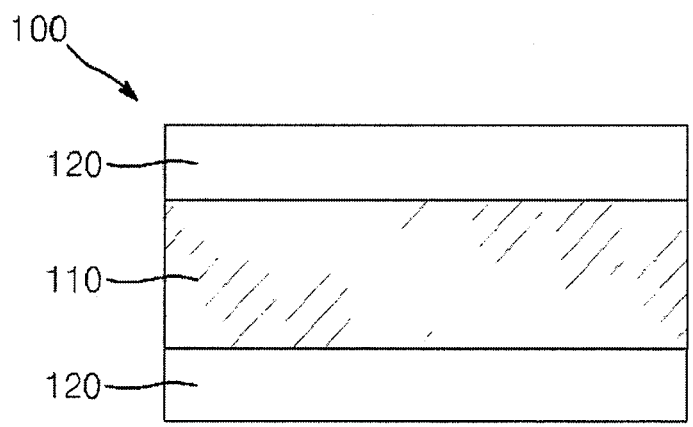
FIG. 2 illustrates a cross-sectional view of a transparent conductor according to another embodiment of the present invention.

Hereinafter, embodiments of the present invention will be described with reference to FIG. 2. FIG. 2 illustrates a cross-sectional view of a transparent conductor according to another embodiment of the present invention. Referring to FIG. 2 a transparent conductor 100 according to another embodiment of the present invention may include a base layer 110, a transparent conductive film 120 on (e.g., formed on) an upper side of the base layer 110 and another transparent conductive film 120 may be on (e.g., formed on) a lower side of the base layer 110. The base layer 110 may be a retardation film. In FIG. 2, the transparent conductor is substantially the same as the transparent conductor according to the embodiment of the invention shown in FIG. 1 except that another transparent conductive film 120 is further on (e.g., formed on) a lower side of the base layer. For example, the transparent conductive films 120 shown in FIG. 2 may be the same (or substantially the same) as the transparent conductive film 120 described above with respect to FIGS. 1 and 5.

Figure 3:
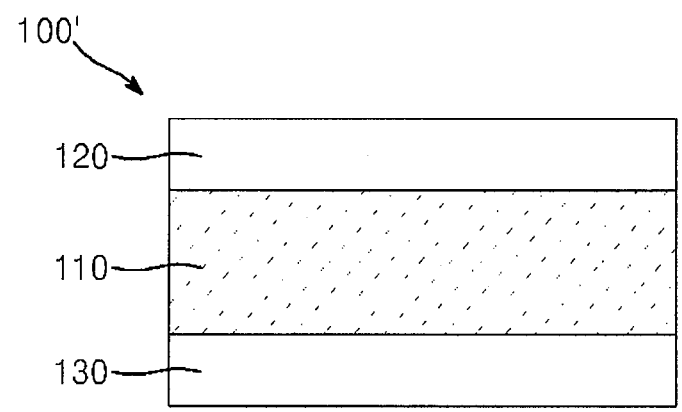
FIG. 3 illustrates a cross-sectional view of a transparent conductor according to yet another embodiment of the present invention.

A transparent conductor according to another embodiment is shown in FIG. 3. Referring to FIG. 3, a transparent conductor 100' may include a base layer 110, a first transparent conductive film 120 on (e.g., formed on) an upper side of the base layer 110, and a second transparent conductive film 130 on (e.g., formed on) a lower side of the base layer 110, wherein the base layer 110 may be a retardation film. In FIG. 3, the transparent conductor is substantially the same as the transparent conductor according to the embodiment of the invention shown in FIG. 1 except that a second transparent conductive film is further on (e.g., formed on) a lower side of the base layer.

The second transparent conductive film 130 may be on (e.g., formed on) the lower side (e.g., an other side) of the base layer 110 which has the first transparent conductive film 120 on one side. Thus, the second transparent conductive film 130 may increase or improve support for the base layer 110. The second transparent conductive film 130 may have (or embody) conductivity (e.g., electrical conductivity) by including a conductive material. The conductive material may include a carbon-nanotube, and/or a mixture of metal nanowire and a conductive polymer. The conductive polymer may include PEDOT(poly(3,4-ethylenedioxythiophene), PEDOT:PSS(poly(3,4-ethylenedioxythiophene:polystyrenesulfonate) and/or the like.

In one example, the thickness of the second transparent conductive film 130 may be the same as or different from that of the first transparent conductive film 120. In one embodiment, the thickness of the second transparent conductive film 130 may be the same (or substantially the same) as that of the first transparent conductive film 120, to achieve the same (or substantially the same) resistance after patterning. For example, the thickness of the second transparent conductive film 130 may be about 10 nm to about 1 µM, about 50 nm to about 500 nm, or about 100 nm to about 200 nm.

Hereinafter, embodiments of an apparatus will be described. An apparatus according to one embodiment of the present invention may include the transparent conductor according to one embodiment of the present invention, and/or a patterned form thereof. For example, the apparatus may include, but is not limited to, optical display apparatuses, E-papers, or solar cells. The optical display apparatuses may include touch panels, touch screen panels, flexible displays and/or the like.

Figure 5:
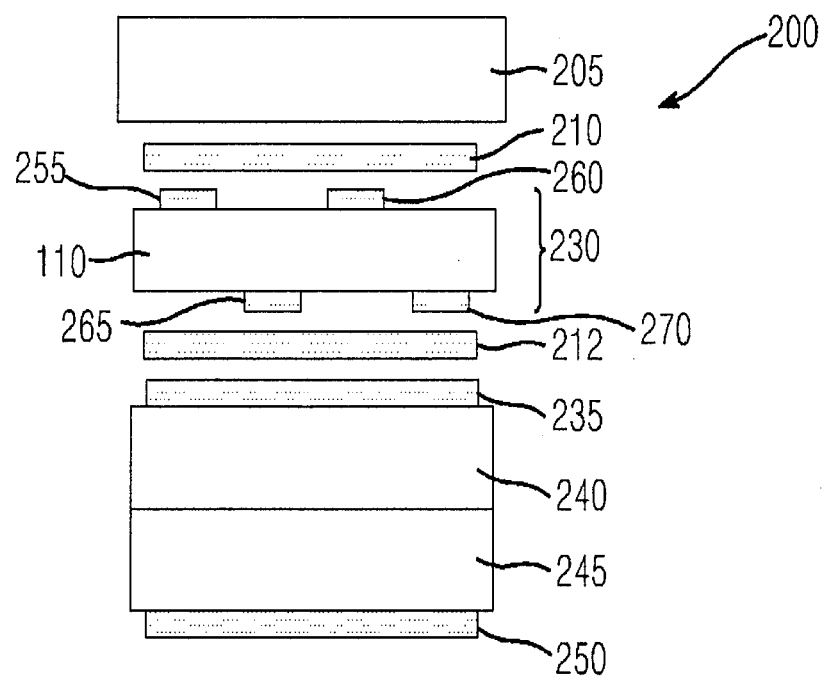
FIG. 5 illustrates a cross-sectional view of an optical display apparatus according to one embodiment of the present invention.
Figure 6:
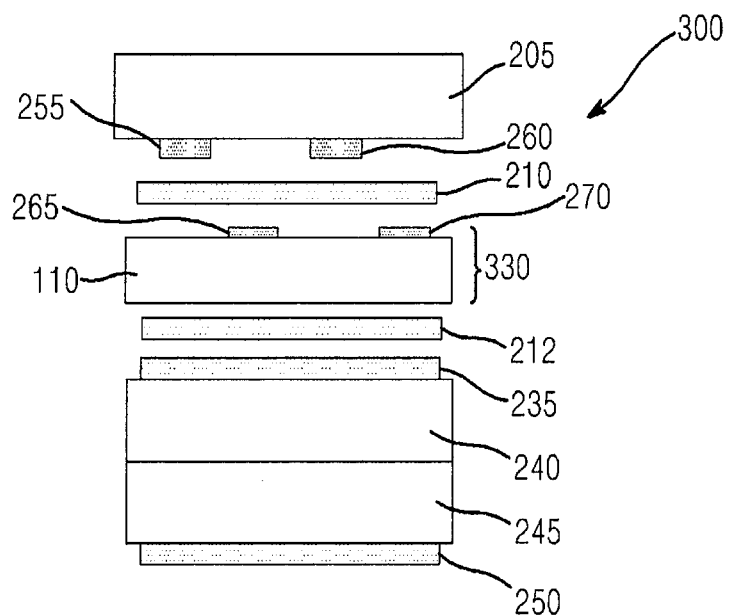
FIG. 6 illustrates a cross-sectional view of an optical display apparatus according to another embodiment of the present invention.
Figure 7:
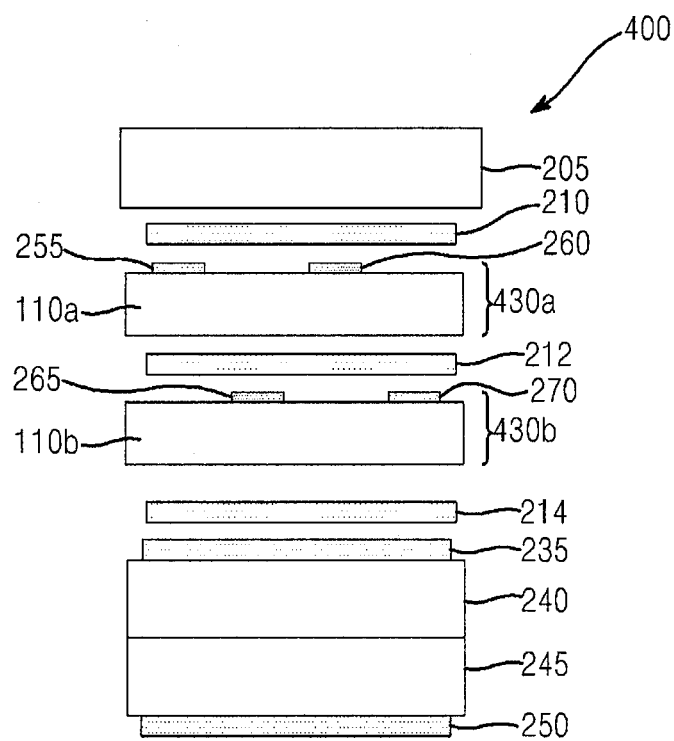
FIG. 7 illustrates a cross-sectional view of an optical display apparatus according to a further embodiment of the present invention.

Hereinafter, an optical display apparatus according to embodiments of the present invention will be described with reference to FIGS. 5 to 7. FIGS. 5 to 7 are cross-sectional views of optical display apparatuses according to embodiments of the present invention.

Referring to FIG. 5, an optical display apparatus 200 may include a transparent electrode assembly 230 including a base layer 110, first and second electrodes 255, 260 on an upper side of the base layer 110, and third and fourth electrodes 265, 270 on a lower side of the base layer 110; a window 205 over (or on) an upper side of the first and second electrodes 255, 260; a first polarizing plate 235 over a lower side of the third and fourth electrodes 265, 270; a COLOR FILTER(CF) 240 on a lower side of a first polarizing plate 235; a panel 245 including a thin film transistor (TFT) on a lower side of the CF 240; and a second polarizing plate 250 on a lower side of the TFT 245. The transparent electrode assembly 230 may be manufactured by patterning a transparent conductor according to an embodiment described above with respect to FIGS. 1-4 (e.g., an embodiment of a transparent conductor which includes the first transparent conductive film on (e.g., formed on) upper and lower sides of the base layer).

The transparent electrode assembly 230 may be prepared by patterning the first and second transparent conductive films 120, 130, respectively, using any suitable method (e.g., etching, and/or the like) to form the first electrode 255, the second electrode 260, the third electrode 265 and the fourth electrode 270. In addition, the base layer 110 may be a retardation film, and thus have an effect of compensating viewing angles (e.g., may compensate for an angle at which a display is viewed), for example, for light transmitted through the second polarizing plate 250, the CF 240, the TFT 245, and the first polarizing plate 235.

The first and second electrodes 255, 260 may be receiver electrodes (Rx electrodes), and the third and fourth electrodes 265, 270 may be transmitter electrodes (Tx electrodes), or vice versa.

The window 205 may perform a screen display function in the optical display apparatus and may be prepared from any suitable glass material or plastic film. The first and second polarizing plates 235, 250 may polarize external or internal light to impart polarization capabilities to the optical display apparatus, and may include a polarizer, or a laminate of a polarizer and a protective film. In addition, the polarizer and the protective film may include any suitable polarizer or protective film available in the field of polarizing plates.

Adhesive films 210, 212 may be between (e.g., may be placed between) the window 205 and the transparent electrode assembly 230, and between the transparent electrode assembly 230 and the first polarizing plate 235, respectively, thereby maintaining adhesion between the transparent electrode assembly 230 and the window 205, and between the transparent electrode assembly 230 and the first polarizing plate 235. The adhesive films 210, 212 may be any suitable adhesive film available in the art, for example, any suitable optical clear adhesive (OCA) film.

Referring to FIG. 6, an optical display apparatus 300 of another embodiment may include a transparent electrode assembly 330 including a base layer 110, and third and fourth electrodes 265, 270 on an upper side of the base layer 110. The optical display apparatus 300 may further include a window 205, having first and second electrodes 255, 260 on a lower side thereof, and over (or formed over) an upper side of the third and fourth electrodes 265, 270; a first polarizing plate 235 on (or over) a lower side of the transparent electrode assembly 330; a COLOR FILTER(CF) 240 on a lower side of the first polarizing plate 235; a panel 245 including a thin film transistor (TFT) on a lower side of the CF 240; and a second polarizing plate 250 on a lower side of the TFT 245. The transparent electrode assembly 330 may be manufactured by patterning an embodiment of the transparent conductor. The embodiment of the apparatus shown in FIG. 6 may be the same (or substantially the same) as the apparatus of the embodiment shown in FIG. 5, except that the transparent electrode assembly was manufactured by patterning an embodiment of the transparent conductor, and the first and second electrodes are on (e.g., formed on) a lower side of the window.

The transparent electrode assembly 330 may be prepared by patterning the first transparent conductive film 120 of the transparent conductor shown in FIG. 1 using any suitable method to form third and fourth electrodes 265, 270. In addition, the base layer 110 may be a retardation film, and thus have an effect of compensating viewing angles (e.g., may compensate for an angle at which a display is viewed), for example, for light transmitted through the second polarizing plate 250, the CF 240, the TFT 245, and the first polarizing plate 235. The first and second electrodes 255, 260 may be formed by using any suitable method available for forming electrodes.

Referring to FIG. 7, an optical display apparatus 400 of another embodiment may include a first transparent electrode assembly 430a including a first base layer 110a, and first and second electrodes 255, 260 on an upper side of the first base layer 110a. The optical display apparatus 400 may further include a second transparent electrode assembly 430b on a lower side of the first transparent electrode assembly 430a including a second base layer 110b, and third and fourth electrodes 265, 270 on an upper side of the second base layer 110b; a first polarizing plate 235 on a lower side of the second transparent electrode assembly 430b; a COLOR FILTER(CF) 240 on a lower side of the first polarizing plate 235; a thin film transistor (TFT) 245 on a lower side of the CF 240; and a second polarizing plate 250 on a lower side of the TFT 245. The first transparent electrode assembly 430a and the second transparent electrode assembly 430b may be manufactured by patterning an embodiment of the transparent conductor. The embodiment of the apparatus shown in FIG. 7 may be the same (or substantially the same) as the apparatus of other embodiments (e.g., as shown in FIG. 6), except that the transparent electrode assembly was prepared by patterning the transparent conductor of one embodiment laminated as an adhesive film (e.g., the transparent electrode assembly includes a first transparent electrode assembly, an adhesive film and a second transparent electrode assembly, laminated in that order).

The first and second transparent electrode assemblies 430a, 430b may be prepared by patterning the first transparent conductive film 120 of the embodiment of the transparent conductor shown in FIG. 1 using any suitable method to form the first, second, third, and fourth electrodes. In addition, the base layer may be a retardation film, and thus have an effect of compensating viewing angles (e.g., may compensate for an angle at which a display is viewed), for example, for light transmitted through the second polarizing plate 250, the CF 240, the TFT 245, and the first polarizing plate 235.

Adhesive films 210, 212, 214 may be between (or may be placed between) the first transparent electrode assembly 430a and the window 205, between the first transparent electrode assembly 430a and the second transparent electrode assembly 430b, and between the second transparent electrode assembly 430b and the first polarizing plate 235, respectively, thereby maintaining the adhesion between the respective ones of the transparent electrode assemblies, the window, and the first polarizing plate. The adhesive films 210, 212, 214 may each be any suitable adhesive film available in the art, for example, any suitable optical clear adhesive (OCA) film. In addition, the base layers (e.g., the first base layers and/or the second base layers) may also include laminates having resin films stacked via adhesives and/or the like.

Hereinafter, the construction and functionality of the present invention will be described with reference to Examples. However, it should be noted that these Examples are provided for illustration of embodiments of the present invention, and are not to be construed in any way as limiting the present invention.

Details of the components used in the Examples and Comparative Examples are set out in Table 1:

TABLE 1

| | Materials | Manufacturers | Product Names | Details |
|---|---|---|---|---|
| Base layer 1 | Retardation PC film | Teijin Chemical | WRS-148 | Polycarbonate film having a λ/4 retardation, thickness: 50 μm |
| Base layer 2 | Retardation COP film | Zeon | ZM16-138 | Cyclic olefin polymer film having a λ/4 retardation, thickness: 50 μm |
| Base layer 3 | HC PET film | Kimoto | 100CBP | Hard coated polyethylene terephthalate film with no retardation |
| Base layer 4 | HC COP film | Zeon | ZF14-050 | Hard coated cyclic olefin polymer film with no retardation |
| | Solution containing metal nanowires | Cambrios | Clear Ohm ink | Including silver nanowire, binder, thickener and dispersant. |
| | Binder | Sartomer | SR506A | — |
| | | SK Cytec | TMPTA | — |
| | Initiator | CIBA | IRG-184 | — |

EXAMPLE 1

A metal nanowire layer composition was prepared by adding 50 parts by weight of a solution containing metal nanowires (for example, Clearohm™ ink, including total 1.65 wt % of the metal nanowires and the binders (weight ratio of metal nanowire: binder=1:1.65), 1 wt % or less of thickeners, dispersants and/or the like, and solvents) to 50 parts by weight of a pure distilled water while stirring. An overcoat layer composition was prepared by adding 0.5 parts by weight of SR506A (as a binder), 0.5 parts by weight of TMPTA (as a binder), and 0.05 parts by weight of IRG-184 (as an initiator) to 99 parts by weight of acetone (as a solvent). The metal nanowire layer composition was coated on a base layer 1 (see Table 1) using a Meyer Bar #18 coating method. The composition was dried at 80° C. for 120 seconds and baked at 140° C. for 120 seconds in an oven. The overcoat layer composition was coated on the resulting metal nanowire layer using a Meyer Bar #18 coating method, dried at 80° C. for 120 seconds and baked at 120° C. for 120 seconds in an oven. Then, the resulting overcoat layer was subjected to UV curing under a metal halide lamp at 500 mJ/cm² in a nitrogen atmosphere to form a transparent conductor including a transparent conductive film including (or consisting of) the metal nanowire layer including a cured product of the metal nanowires, the binders and the initiators on the base layer 1, and the overcoat layer including a cured product of the binders and the initiators.

EXAMPLE 2 AND COMPARATIVE EXAMPLES 1 And 2

In Example 2 and Comparative Examples 1 and 2, a transparent conductor was prepared as in Example 1, except that, as shown in Table 2, the base layer in Example 1 was replaced with one of the base layers identified in Table 1.

The transparent conductor of Examples 1 and 2 and Comparative Examples 1 and 2 were evaluated for their physical properties as described below. The results are shown in Table 2.

Evaluation Method (1) Sheet resistance (Ω/□): After 10 seconds contacting a 4-Pin probe of a contact-type sheet resistance tester MCP-T610 (available from Mitsubishi Chemical Analytech Co., Ltd.) with a surface of the transparent conductive film of the transparent conductor, sheet resistance was measured with an R-check (a contact resistance of the 4-Pin probe).

(2) Haze and total transmittance (%): A surface of the transparent conductive film was disposed to face a light source, and a haze value and a total transmittance of the transparent conductor were measured using a haze meter (NDH-9000) at a wavelength of 400 nm to 700 nm.

(3) Optical property: nx, ny and nz values of the transparent conductor were measured and calculated using an AxoScan (Axometrics, Inc.).

TABLE 2

| | Types of base layers | Sheet resistance (Ω/□) | Haze value (%) | Total light transmittance (%) | Optical properties | | | | |
|---|---|---|---|---|---|---|---|---|---|
| | | | | | Ro (nm) at a wavelength of 550 nm (A) | Ro (nm) at a wavelength of 450 nm (B) | Ro (nm) at a wavelength of 650 nm (C) | B/A | C/A |
| Example 1 | Base layer 1 | 50~60 | 1.04 | 90.27 | 142.52 | 128.628 | 145.37 | 0.90 | 1.02 |
| Example 2 | Base layer 2 | 50~60 | 1.12 | 90.22 | 136.23 | 144.40 | 138.95 | 1.06 | 1.02 |
| Comparative Example 1 | Base layer 3 | 50~60 | 0.90 | 90.92 | 0.808 | 0.678 | 2.084 | 0.84 | 2.58 |
| Comparative Example 2 | Base layer 4 | 50~60 | 1.09 | 90.25 | 119.11 | 103.62 | 179.85 | 0.87 | 1.51 |

* B/A: ratio of an Ro value B in nm at a wavelength of 450 nm to an Ro value A in nm at a wavelength of 550 nm for the transparent conductor.
* C/A: ratio of an Ro value C in nm at a wavelength of 650 nm to an Ro value A in nm at a wavelength of 550 nm for the transparent conductor.

In table 2, it can be seen that the transparent conductor according to embodiments of the present invention had B/A and C/A values within ranges according to embodiments of the present invention, thus achieving an effect of compensating viewing angles and increasing visibility when applied to a display.

Accordingly, the transparent conductor according to embodiments of the present invention may have transparency, conductivity and an effect of compensating viewing angles (e.g., may compensate for an angle at which a display is viewed), and also increase viewing angles for the increased area of optical display apparatuses.

On the other hand, the transparent conductors of Comparative Examples 1 and 2 in which the base layers were not retardation films had B/A and C/A values outside of the ranges of embodiments of the present invention and did not achieve an effect of compensating viewing angles, and would not increase visibility when applied to a display.

While the present invention has been described in connection with certain embodiments, it will be understood by those skilled in the art that the invention is not limited to the disclosed embodiments, but, on the contrary, is intended to cover various modifications and equivalent arrangements included within the spirit and scope of the appended claims, and equivalents thereof.

What is claimed is:

1. A transparent conductor comprising:
    a base layer; and
    a transparent conductive film directly on one or both sides of the base layer, the transparent conductive film comprising a metal nanowire,
    wherein the base layer comprises a retardation film, and
    wherein the base layer has a retardation value of an in-plane direction, Ro, of about 140 nanometers (nm) to about 280 nm at a wavelength of 550 nm, an Ro value of about 120 nm to about 140 nm at a wavelength of 450 nm, and an Ro value of about 130 nm to about 155 nm at a wavelength of 650 nm,
    wherein Ro is defined by Formula 1:

$$Ro = (nx - ny) \times d \quad \text{Formula 1}$$

wherein, in Formula 1, nx and ny are refractive indices in the x-axis and y-axis directions of the transparent conductor, respectively, and d is a thickness of the base layer in nm.

2. The transparent conductor according to claim 1, wherein the transparent conductor has a ratio B/A of about 0.9 to about 1.1, B/A being a ratio of an Ro value B in nanometers (nm) at a wavelength of 450 nm to the Ro value A in nm at a wavelength of 550 nm.

3. The transparent conductor according to claim 1, wherein the transparent conductor has a ratio C/A of about 0.9 to about 1.1, C/A being a ratio of an Ro value C in nanometers (nm) at a wavelength of 650 nm to the Ro value A in nm at a wavelength of 550 nm.

4. The transparent conductor according to claim 1, wherein the transparent conductor has a thickness of about 10 μm to about 250 μm.

5. The transparent conductor according to claim 1, wherein the transparent conductor has a λ/4 retardation or a λ/2 retardation.

6. The transparent conductor according to claim 1, wherein the base layer is a λ/2 retardation film or a λ/4 retardation film.

7. The transparent conductor according to claim 1, wherein the base layer comprises a polycarbonate, cyclic olefin, polyester, non-cyclic olefin, polysulfone, polyimide, silicone, polystyrene, polyacryl, and/or polyvinyl chloride film.

8. The transparent conductor according to claim 1, further comprising one or more of a hard coating layer, an anti-corrosive layer, an anti-glare coating layer, an adhesion promoter, or a coating layer for reducing elution of an oligomer from the base layer on one or both sides of the base layer.

9. The transparent conductor according to claim 1, wherein the metal nanowire comprises a silver nanowire.

10. The transparent conductor according to claim 1, wherein the metal nanowire has an aspect ratio L/d of about 10 to about 1,000, the aspect ratio L/d being a ratio of a length L of the metal nanowire to a diameter d of a cross-section of the metal nanowire.

11. The transparent conductor according to claim 1, wherein the metal nanowire is present in the transparent conductive film in an amount of not less than 13 wt %, based on the total weight of the transparent conductive film.

12. The transparent conductor according to claim 1, wherein the transparent conductive film comprises:
a metal nanowire layer comprising a cured product of the metal nanowire, a binder and an initiator; and
an overcoat layer comprising a cured product of the binder and the initiator on the metal nanowire layer.

13. The transparent conductor according to claim 12, wherein the binder comprises one or more of a urethane (meth)acrylate oligomer, or a (meth)acrylate based monofunctional or multifunctional monomer.

14. The transparent conductor according to claim 1, wherein the transparent conductive film comprises a cured product of the metal nanowire, a binder and an initiator.

15. The transparent conductor according to claim 14, wherein the binder comprises one or more of a urethane (meth)acrylate oligomer, or a (meth)acrylate based monofunctional or multifunctional monomer.

16. The transparent conductor according to claim 14, wherein the cured product of the metal nanowire, the binder and the initiator comprises a cured product of a composition comprising about 13 wt % to about 23 wt % of the metal nanowire, about 75 wt % to about 85 wt % of the binder, and about 1 wt % to about 3 wt % of the initiator based on the total weight of solids in the composition.

17. The transparent conductor according to claim 1, wherein the base layer has a thickness of about 50 μm to about 150 μm, and the transparent conductive film has a thickness of about 10 nm to about 1 μm.

18. The transparent conductor according to claim 1, wherein the transparent conductor has an Ro of 120 nanometers (nm) to 150 nm at a wavelength of 450 nm, and an Ro of 130 nm to 155 nm at a wavelength of 650 nm.

19. An optical display apparatus comprising the transparent conductor according to claim 1.

20. The transparent conductor according to claim 1, wherein the retardation value of the in-plane direction, Ro, of the base layer is 150 nm to 280 nm at a wavelength of 550 nm.

\* \* \* \* \*